(12) United States Patent
Srivastava et al.

(10) Patent No.: US 12,111,359 B2
(45) Date of Patent: Oct. 8, 2024

(54) METHOD OF MONITORING JOINT AND CONTACT CONDITIONS IN AN ELECTRICAL NETWORK

(71) Applicant: EATON INTELLIGENT POWER LIMITED, Dublin (IE)

(72) Inventors: Jagdambika P. Srivastava, Gonda (IN); Prasad A. Venikar, Pune (IN); Joshua David Myers, Fletcher, NC (US); Mark A. Gould, Hendersonville, NC (US); Charlie Hume, Asheville, NC (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 170 days.

(21) Appl. No.: 17/550,251

(22) Filed: Dec. 14, 2021

(65) Prior Publication Data
US 2023/0184834 A1 Jun. 15, 2023

(51) Int. Cl.
*G01R 31/327* (2006.01)
(52) U.S. Cl.
CPC ................ *G01R 31/3275* (2013.01)
(58) Field of Classification Search
None
See application file for complete search history.

(56) References Cited

U.S. PATENT DOCUMENTS

| | | | |
|---|---|---|---|
| 5,739,594 A * | 4/1998 | Sheppard | H02J 9/06 307/64 |
| 7,034,554 B2 * | 4/2006 | Loucks | G01R 27/205 324/525 |
| 7,812,615 B2 | 10/2010 | Gajic et al. | |
| 10,145,897 B2 | 12/2018 | Fedigan | |
| 2014/0002092 A1 * | 1/2014 | Kodama | H01H 1/0015 324/418 |
| 2014/0117912 A1 * | 5/2014 | Gajic | H02H 7/06 318/490 |
| 2014/0159740 A1 * | 6/2014 | Schuster | H02H 7/266 324/522 |
| 2015/0180275 A1 * | 6/2015 | Tomassi | H02J 9/061 307/64 |
| 2018/0275199 A1 * | 9/2018 | Parkin | G01R 19/2513 |

FOREIGN PATENT DOCUMENTS

| | | |
|---|---|---|
| CA | 2 477 606 A1 | 2/2005 |
| CN | 109507530 A | 3/2019 |

* cited by examiner

*Primary Examiner* — Nasima Monsur
(74) *Attorney, Agent, or Firm* — Eckert Seamans Cherin & Mellott, LLC

(57) ABSTRACT

A method of monitoring joint and contact conditions in an automatic transfer switch includes: collecting electrical signals at a plurality of measurement locations associated with a plurality of power sources and a load over a predetermined period, the electrical signals including voltages and load current; obtaining deltas between source voltages and corresponding load voltage measured at the measurement locations over the predetermined period; comparing the deltas with thresholds obtained during healthy condition; determining that the deltas fall outside of the thresholds; and in response to determining that the deltas fall outside of the threshold, transmitting an alert to a user, the alert indicating a detection of one or more failure modes at the measurement locations.

19 Claims, 5 Drawing Sheets

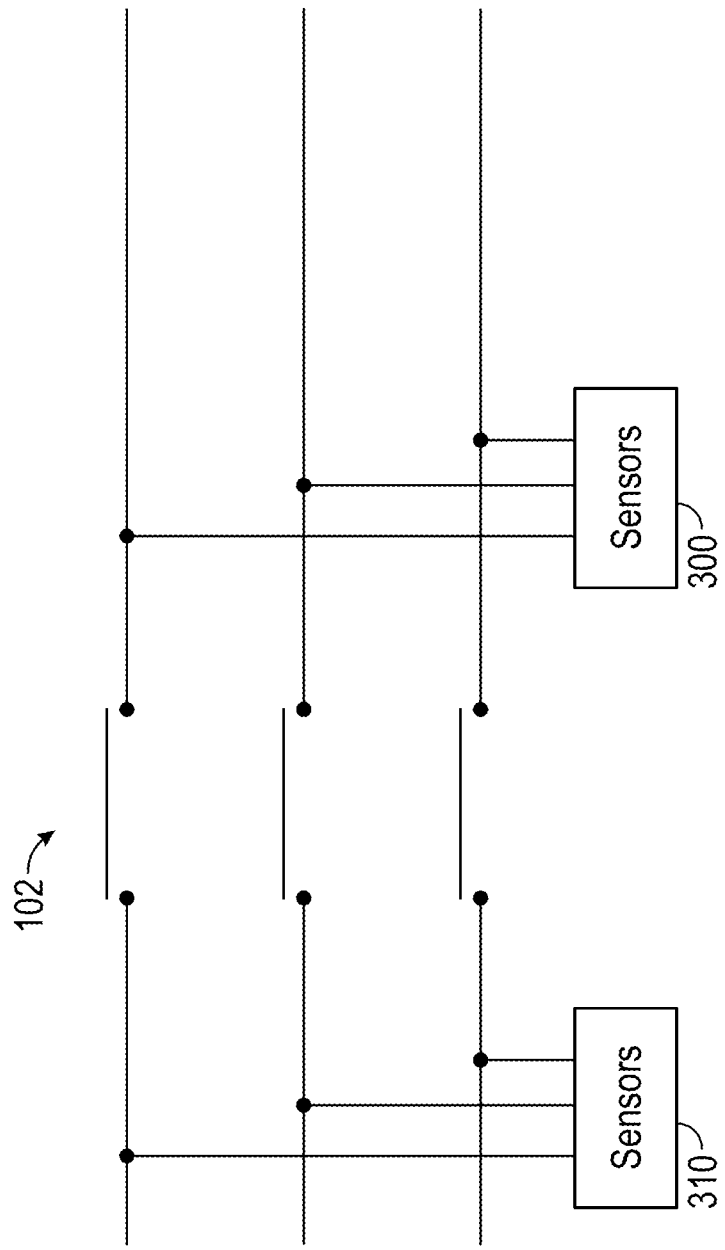

METHOD OF MONITORING JOINT AND CONTACT CONDITIONS IN AN ELECTRICAL NETWORK

FIELD OF THE INVENTION

The disclosed concept relates generally to a method of monitoring joint and contact conditions in an electrical network, and in particular a method of detecting and identifying loose joints, overtight connections, or contact wear conditions in an automatic transfer switch.

BACKGROUND OF THE INVENTION

An automatic transfer switch is a device used to provide continuous supply to a load and protect the load against loss of power (e.g., power outage, decrease in power below a required amount, etc.). During utility power failure, the automatic transfer switch switches a power supply from the utility source to a backup (e.g., a generator). Typically, switching devices (e.g., contactors, circuit breaker or other types of switching devices) are connected with power sources (e.g., the utility power and the backup) at input joint and connected with a load at an output joint through cables by bolted joints. Upon the power failure, a contactor connecting the utility power to the load is disconnected and the other contactor connecting the backup power to the load is connected. When the power is restored, the other contactor connecting the backup power to the load disconnects and the contactor connecting the utility to the load is reconnected. As such, the automatic transfer switch is a critical component for safe and reliable transition between energy sources in cases of emergency. However, the repeated switching operations cause deterioration of the mechanical components, leading to various failure modes. For example, the contactors, joints or connections wear and tear, becoming loose or overtight. High temperature points or hotspots at cable landing due to the loose or overtight joints or connections are key failure modes in the automatic transfer switch. If the loose or overtight joints and/or hotspots are left undetected, arcing events may occur at joint locations, resulting in equipment failure. In order to detect the failure modes, external sensors (e.g., thermal or acoustic sensors) at multiple locations are installed. However, adding the external sensors require associated hardware and spaces for the sensor and hardware installation, resulting in increased designing and monitoring cost. Further, routine maintenance is generally required to detect faulty nodes at, e.g., contacts, joints, etc. For example, every six months or year a field engineer may take temperature sensors and/or a torqueing tool and inspect every joints (e.g., nuts, bolts, contacts, etc.) in order to determine whether any faulty conditions exist. Upon detecting any faulty conditions, the field engineer then retorques the faulty nodes to the specification. Such routine maintenance is time-consuming, ineffective, and reactionary since it allows, among others, corrections only upon on-site detection at preset intervals. If a loose or overtight joint occurred immediately after a routine maintenance, the loose or overtight joint will continue to deteriorate until its detection, e.g., at the next routine maintenance, or the equipment failure.

There is considerable room for improvement in a mechanism to detect failure modes and faulty conditions in an automatic transfer switch.

SUMMARY OF THE INVENTION

These needs, and others, are met by embodiments of the disclosed concept in which a method of monitoring joint and contact conditions in an automatic transfer switch is provided. The method includes: collecting electrical signals at a plurality of measurement locations associated with a plurality of power sources and a load over a predetermined period, the electrical signals including voltages and load current; obtaining deltas between source voltages and corresponding load voltage measured at the measurement locations over the predetermined period; comparing the deltas with thresholds obtained during healthy condition; determining that the deltas fall outside of the thresholds; and in response to determining that the deltas fall outside of the threshold, transmitting an alert to a user, the alert indicating a detection of one or more failure modes at the measurement locations.

Another embodiment provides a method of establishing thresholds for use in detecting a failure mode in an automatic transfer switch. The method includes: collecting electrical signals at a plurality of measurement locations associated with a plurality of power sources and a load over a predetermined period, the electrical signals including voltages and load current; performing data filtering for a predefined number; obtaining deltas between source voltages and corresponding load voltage measured at the measurement locations over the predetermined period; generating trends of the deltas over the predetermined period; and deriving the thresholds based on the trends of the deltas.

BRIEF DESCRIPTION OF THE DRAWINGS

A full understanding of the invention can be gained from the following description of the preferred embodiments when read in conjunction with the accompanying drawings in which:

FIG. 2 is a diagram of voltage measurement locations in accordance with an example embodiment of the disclosed concept;

DETAILED DESCRIPTION OF THE INVENTION

Figure 1:
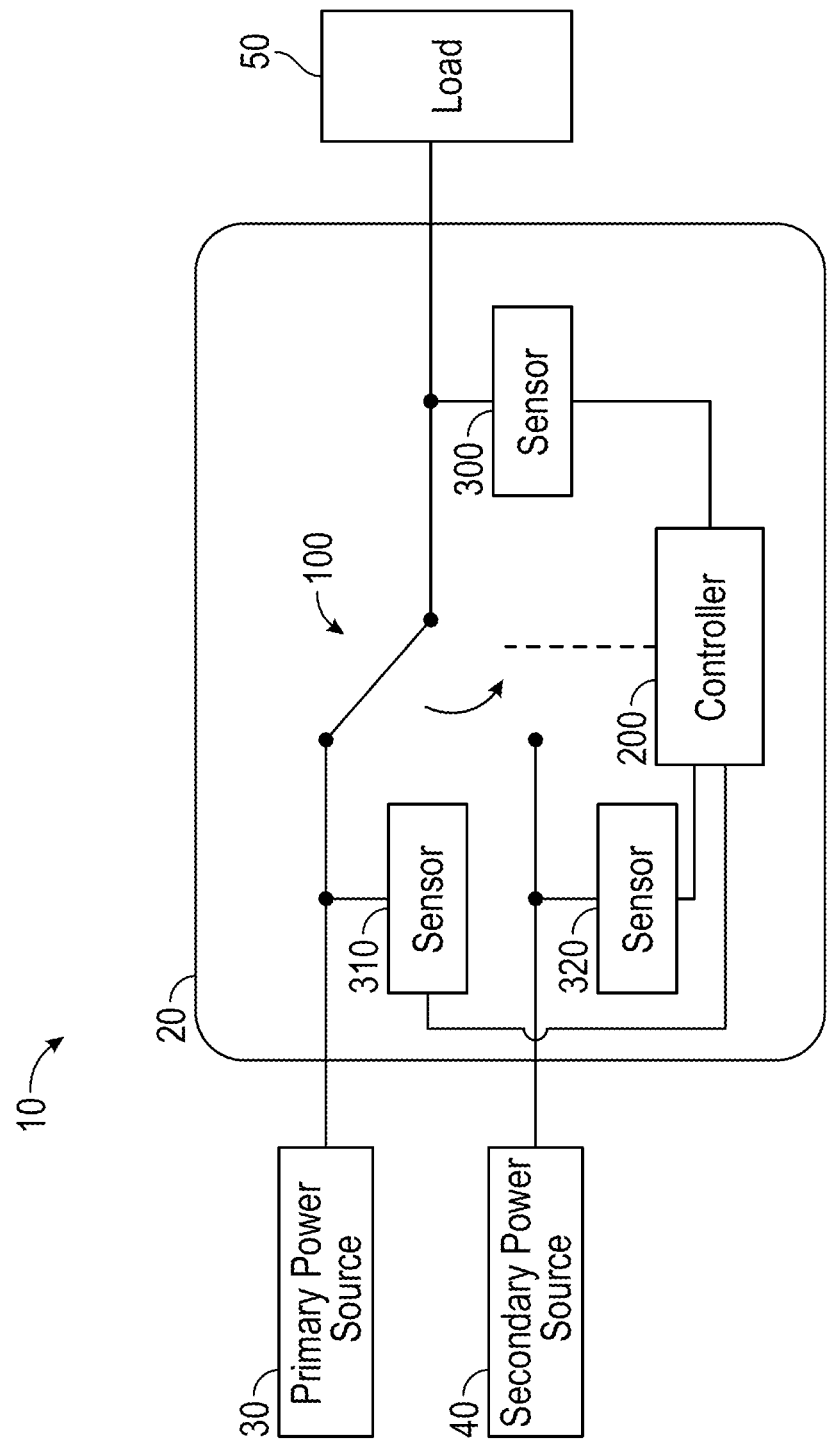
FIG. 1 is a diagram of a power system in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

Some example embodiments of the disclosed concept, which will be described in more detail herein, provide methods to detect and identify, e.g., and without limitation, loose joints, over-tight connection, and contact wear conditions using only the available electrical signals within an automatic transfer switch (ATS). An example embodiment in accordance with the present disclosure uses the three-phase voltage and current measured at source input joints and load output joints and analyzes these signals to detect different failure modes (e.g., loose joint, overtight joint, contact wear and tear, etc.) without having to install external thermal sensors at multiple locations. For example, the method uses the input voltage from the power supply and the output supply voltage to the load, which are measured automatically by the ATS (e.g., internal sensors within the ATS) in general. The method then obtains negative sequence components of the input and output voltages. If the delta between the input source voltage and the load output voltage falls outside of a predetermined threshold amount, then the method determines that there is a problem with the contact joint connecting the source and the load and alerts the location of the contact joint having the problem to a user (e.g., a field engineer) for attention and correction. By using the already available electrical signals, it eliminates a need for installing additional external sensors and hardware associated with the external sensors. Further, detection of the location of the problematic joint or connection based on a delta between the negative sequences of the input and output voltages, the method is computationally simple and does not add a processing burden to a local edge device (e.g., a controller of the ATS). In addition, the method allows the users (e.g., a utility or field engineer) to move from the planned maintenance at preset intervals to proactive maintenance upon detection of the faulty node(s). In sum, the method in accordance with the present disclosure brings value by reducing total cost (time, space and/or monetary) of the ATS ownership.

FIG. 1 is a diagram of a power distribution system 10 in accordance with an example embodiment of the disclosed concept. The power distribution system 10 includes an automatic transfer switch (ATS) 20, a primary power source 30, a secondary power source 40, and a common load 50. The primary power source 30 may be, for example and without limitation, a utility power supply and provides power to the common load 50 during normal operation. The secondary power source 40 may be a backup, emergency power supply, for example and without limitation, a generator, a transformer, etc., and provides power to the common load 50 during utility power outage. However, it will be appreciated that a utility power supply and a backup power supply are provided as an example, other arrangements and types of power sources may be employed without departing from the scope of the disclosed concept. While FIG. 1 shows two power sources 30,40, there may be more than two power sources as appropriate without departing from the scope of the disclosed concept. Additionally, while a single phase of power flowing through the ATS 20 is shown for simplicity of illustration, it will be appreciated that the ATS 20 may accommodate multiple phases of power, such as 3-phase power.

The ATS 20 includes a power switching mechanism 100 operable to selectively switch between providing the common load 50 with power from the primary power source 30 to providing the common load 50 with power from the secondary power source 40, and vice versa. The power switching mechanism 100 may be composed, for example, of one or more contactors. The ATS 20 also includes a controller 200 structured to control operation of the power switching mechanism 100. The controller 200 may control operation of the power switching mechanism 100 based on inputs from one or more sensors 300,310,320 within the ATS 20 or manually via external input. As a result of repeated switching, components in the power switching mechanism 100 or elsewhere in the ATS 20 may experience contact wear. Joints in the power switching mechanism 100 or elsewhere in the ATS 20 may experience loose or overtight conditions, which can result in deteriorated performance.

Figure 4:
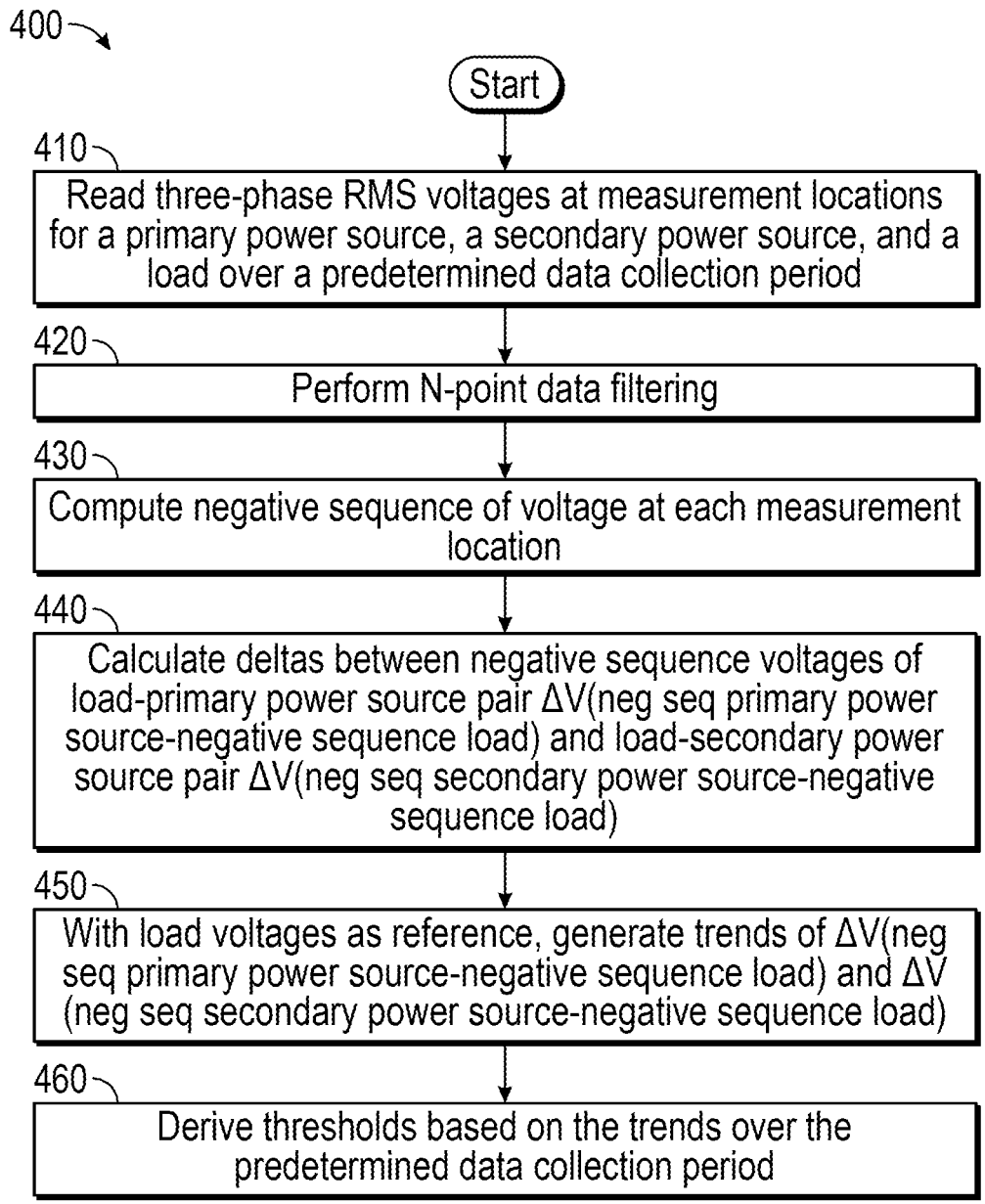
FIG. 4 is a flow chart for a method of establishing thresholds for use in monitoring joint and contact conditions in accordance with an example embodiment of the disclosed concept.

Contact wear and loose or overtight joint conditions can be detected by a change in resistance across the contact or joint. In example embodiment of the disclosed concept, the controller 200 is structured to detect contact wear and loose or overtight joint conditions based on outputs of various sensors 300,310,320 in the ATS 20. In an example embodiment, sensors 300,310,320 are voltage sensors structured to sense voltages at inputs and outputs of the power switching device 100. However, it will be appreciated that the types and locations of the sensors may be varied without departing from the scope of the disclosed concept. For example, the controller 200 receives sensor outputs from before and after the area of interest and determines if there is a condition of concern (e.g., without limitation, contact wear, loose joint, overtight joint) in the area of interest based on the sensor output. As an example, a change in contact resistance is determined based on a voltage change across the area of interest In accordance with an example embodiment of the disclosed concept, the controller 200 obtains negative sequence components of the sensed voltages. In the examples where the phasors are not available, RMS amplitude and hard coded phase angles are used to compute negative sequence. Otherwise, negative sequence from the phasors is computed. If the delta between the negative sequences of sensed voltages falls outside of a predetermined threshold amount, then the method determines that there is a problem with the contact joint connecting the source and the load and alerts the location of the contact joint (e.g., without limitation, primary power source phase-a input joint) having the problem to a user for attention and correction. The predetermined threshold may be derived, for example, over a predetermined data collection period by the controller 200 or the manufacturer as illustrated in FIG. 4. The controller 200 may include a processor and a memory. The processor may be, for example and without limitation, a microprocessor, a microcontroller, or some other suitable processing device or circuitry, that interfaces with the memory. The memory can be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory.

FIG. 2 illustrates an example of voltage sensing locations corresponding to sensing contact wear in a contactor 102 associated with the primary power source 30 of the ATS 20 of FIG. 1. In FIG. 2, 3-phases are shown with a contactor 102 that connects or disconnects power from the 3-phases. Sensors 310 sense voltages of each of the 3 phases at the input side of the contacts 102 and sensors 300 sense voltages of each of the 3 phases at output sides of the contacts 102. While FIG. 2 illustrates voltage measurement locations for when the area of interest is a contact, it will be appreciated that a similar arrangement may be used to sense voltages across a joint, with voltage sensors arranged at input sides and output sides of the joint.

In general, a loose joint or overtight condition or contact wear can be characterized by change in contact resistance value as compared to contact resistance value of healthy condition. A change in contact resistance reflects in voltage drops at the first, second or third measurement location.

Voltage drop $V_{drop}$ is a function of the load current and change in contact resistance as follows:

$$V_{drop} = f(\text{Load current, change in contact resistance}) \quad \text{EQ. 1}$$

Hence, in order to establish thresholds used for detecting overtight, loose or worn out conditions, the three-phase voltage measurements are performed at two ends (i.e., input side and output side) simultaneously. Next, negative sequence components of voltages $V_{neg}$ are calculated as shown below:

$$V_{neg} = \frac{1}{3} \begin{bmatrix} 1 & a^2 & a \end{bmatrix} \begin{bmatrix} V_a \\ V_b \\ V_c \end{bmatrix} \quad \text{EQ. 2}$$

where $V_a$ is phase-a voltage, $V_b$ is phase-b voltage, $V_c$ is phase-c voltage and a is an operator equal to $1\angle 120°$ and $a^2$ is an operator equal to $1\angle 240°$. The delta between the source and load negative sequence is then computed to define a trendline for a healthy condition. Any additional change in resistance results in deviation in voltage drop that reflects in negative sequence voltage drop. As a result, the trendline shifts with respect to the healthy condition for individual load level. This can be scaled to one level with normalization.

Figure 3A:
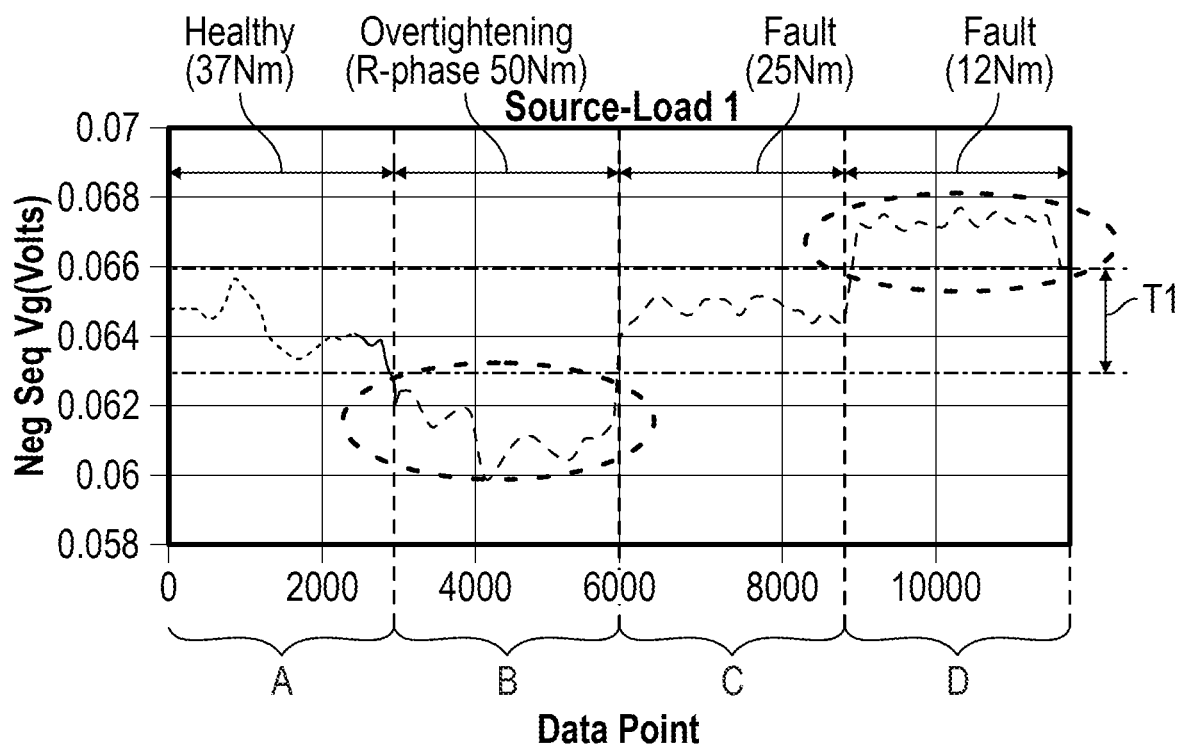
FIGS. 3A-B illustrate experimental results of a method of monitoring joint and contact conditions in accordance with an example embodiment of the disclosed concept.
Figure 3B:
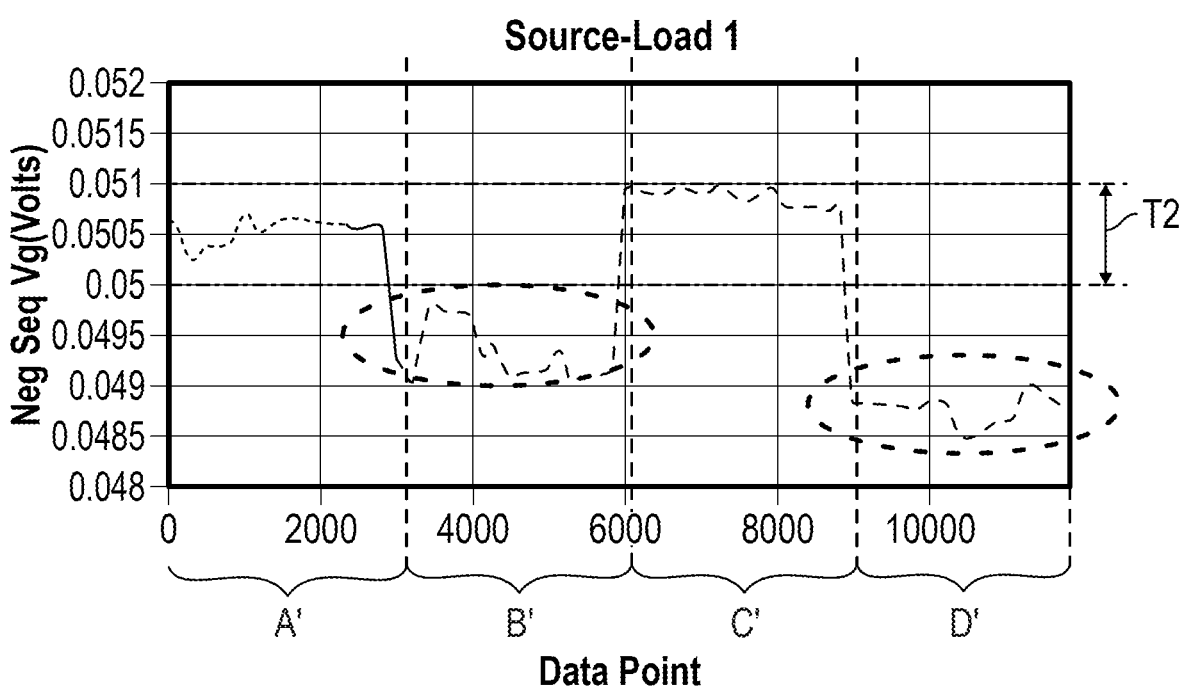

FIGS. 3A-B illustrate experimental results of applying a method of monitoring joint and contact conditions according to an example embodiment of the disclosed concept. FIG. 3A shows the experimental results for phasor voltage measurements when both magnitude and phase angles are being recorded for voltage measurements, and FIG. 3B shows the experimental results for RMS (root-mean-square) voltage measurements when only RMS voltage magnitudes are available. In FIG. 3A, a first set of experiments was performed on a 1600 A contactor sample considering 37 N/m tightening as a base torque in healthy condition. After conducting the first set of experiments with healthy condition, a trend A of the deltas between the primary power source and load phasor voltage measurements in healthy conditions were obtained and based on the trend A, thresholds T1 for use in monitoring joint and contact conditions are established. The thresholds T1 range from 0.063V to 0.066V. It will be understood that the thresholds change over time and depend on the use, age, and type of the joints, contacts, or equipment in which the joints and contacts are used. Subsequently, three tests were performed with 50 N/m, 25 N/m and 12 N/m torque conditions, and voltage drops together with temperatures at the measurement location(s) were recorded. An external temperature sensor was used to obtain direct temperature measurements at the measurement location for the experiments. At 50 N/m torque, trend B fell below the thresholds T1 and indicated an overtight condition at the measurement location. In the overtight conditions, no temperature rise was recorded. At 25 N/m torque, no significant temperature change was recorded and trend C indicated the negative sequence delta remained within the thresholds T1. However, at 12 N/m torque, trend D of the deltas fell outside of the thresholds T1, indicating presence of a hotspot at the measurement location. For this loose condition, a temperature rise of the order of 6° C. was also recorded. Under the method in accordance with the present disclosure, similar trends A',B',C',D' in RMS voltage measurements (with no dependency on phase angles) were obtained. While trend D' fell below the thresholds T2, trend D' still fell outside of the thresholds T2, clearly indicating a failure mode at the measurement location. Thus, the experimental results indicate that three-phase RMS measurements (with hard coded phase angles) may be used to detect the failure modes for overtight and/or loose joint conditions.

FIG. 4 is a flow chart of a method 400 of establishing thresholds for use in monitoring joint and contact conditions according to an example embodiment of the disclosed concept. The method 400 may be performed by the controller 200 or other components of the automatic transfer switch 20 as described with reference to FIG. 1. The method 400 may be performed at manufacturing or on site by a field engineer as needed. For example, if an overtight or loose joint was repaired via retorqueing, new thresholds may be established by the engineers on site.

At 410, three-phase RMS voltages $V_a$, $V_b$, $V_c$ at input and output sides of an area of interest (e.g., contacts, joints, etc.) are sensed for a predetermined data collection period. Voltages are measured at a joint for each phase and sampled for predefined count N, where N is an integer, for example and without limitation, 100. The predetermined data collection period may be, e.g., without limitation, 6 months, 1 year, etc. It is desirable to tune the predetermined data collection period in such a way that it covers most of duty cycles seen by the ATS during operation.

At 420, N-point data filtering is performed. Data filtering may be performed by any suitable noise filtering mechanism. For example, a moving average of the measured voltages over the data window may be performed. In order to optimize the space requirements, a recursive buffer-based addition for each input parameter is performed. The recursive buffer-based addition may be performed irrespective of using the RMS or phase-based measurement approach. Once the predefined count N is reached, the average for that data window is computed. This sliding windowed moving approach eliminates effects arising due to asynchronous measurements at source and load locations, and overcomes impacts of jitters. In some examples, the controller performs moving average for RMS voltages using an algorithm, which first sets sum of phase-A voltage $V_{a,sum}$ and moving average count at zero, then acquires RMS $V_a$, then adds the RMS $V_a$ to the $V_{a,sum}$ and increments the moving average count by 1, and finally, upon reaching N, obtains the moving average by dividing the resultant $V_{a,sum}$ by N.

At 430, the controller computes negative sequences of voltage measurements at measurement locations for the primary power source, the secondary power source and the load.

At 440, the controller calculates deltas between negative sequence voltages of the load-primary power source pair $\Delta V_{(neg\ seq\ primary\ power\ source-neg\ seq\ load)}$ and the load-secondary power source pair $\Delta V_{(neg\ seq\ secondary\ power\ source-neg\ seq\ load)}$.

At 450, with load voltages as reference, the controller generates a trend of $\Delta V_{(neg\ seq\ primary\ power\ source-neg\ seq\ load)}$ and $\Delta V_{(neg\ seq\ secondary\ power\ source-neg\ seq\ load)}$.

At 460, the controller derives thresholds based on the trends over the predetermined data collection period. Thus, the deltas are trended, and the trends are plotted to define thresholds based on load profiles covered during the predetermined data collection period as shown in FIGS. 3A-B.

Figure 5:
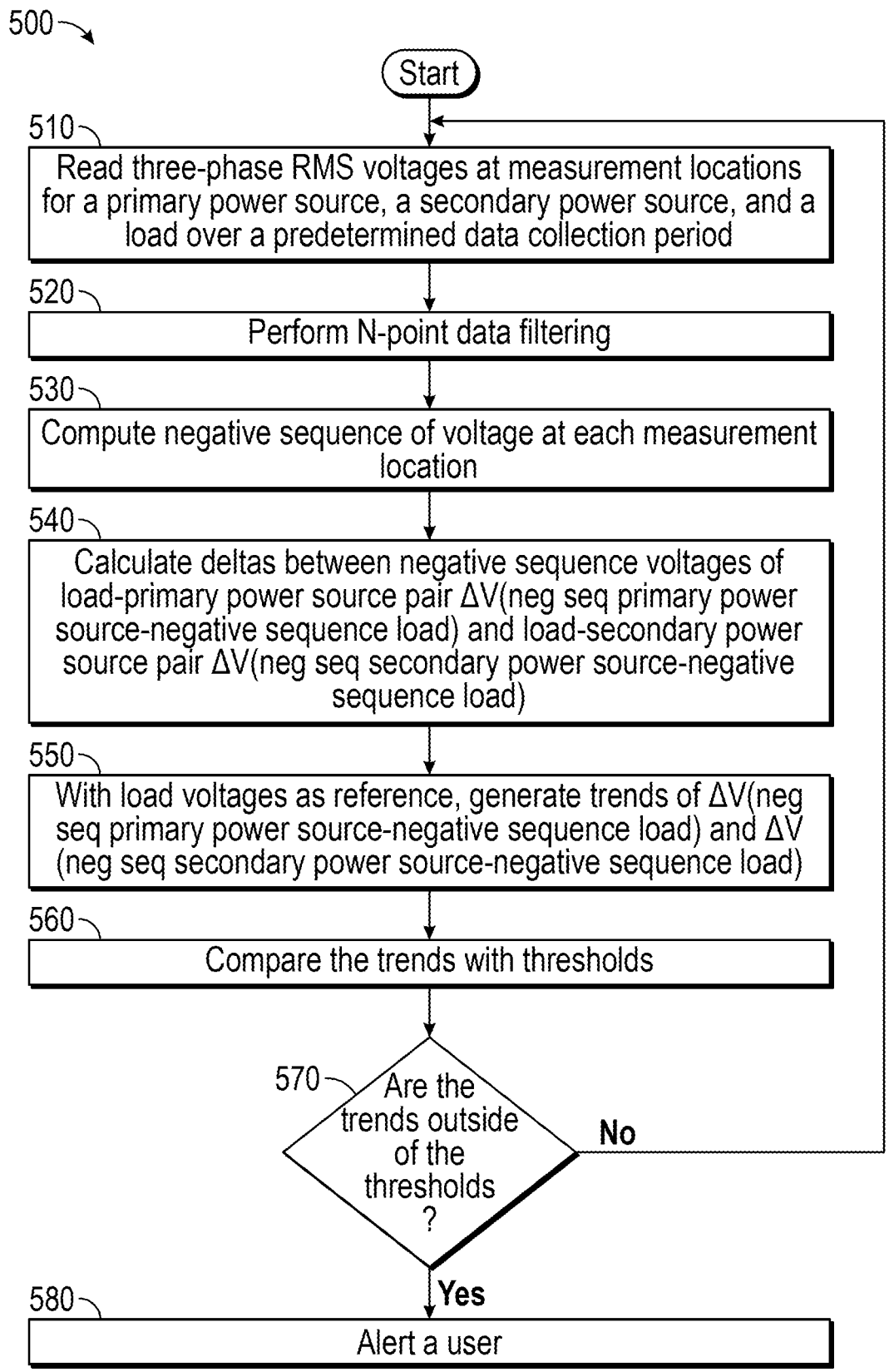
FIG. 5 is a flow chart for a method of monitoring joint and contact conditions in accordance with an example embodiment of the disclosed concept.

FIG. 5 is a flow chart of a method 500 for detecting and identifying a loose or overtight joint conditions or contact wear according to an example embodiment of the disclosed concept. The method 500 may be performed by the controller 200 or other components of the automatic transfer switch 20 of FIG. 1.

At 510, a controller of an automatic transfer switch (ATS) reads three-phase RMS voltages $V_a$, $V_b$, $V_c$ at input and output sides of an area of interest (e.g., contacts, joints, etc.) for a predetermined data collection period (e.g., without limitation, 6 months, 1 year). Voltages are measured at a joint for each phase and sampled for predefined count N, where N is an integer, for example and without limitation, 100.

At 520, N-point data filtering is performed. Data filtering may be performed by any suitable noise filtering mechanism. For example, moving average of the measured voltages over the data window may be performed. In order to optimize the space requirements, a recursive buffer-based addition for each input parameter is performed. The recursive buffer-based addition may be performed irrespective of using the RMS or phase-based measurement approach. Once the predefined count N is reached, the average for that data window is computed. This sliding windowed moving approach eliminates effects arising due to asynchronous measurements at source and load locations. In some examples, the controller performs moving average for RMS voltages using an algorithm, which first sets sum of phase-A voltage $V_{a,sum}$ and moving average count at zero, then acquires RMS $V_a$, then adds the RMS $V_a$ to the $V_{a,sum}$ and increments the moving average count by 1, and upon reaching N, obtains the moving average by dividing the resultant $V_{a,sum}$ by N.

At 530, the controller computes negative sequences of voltage measurements at measurement locations for the primary power source, the secondary power source and the load.

At 540, the controller calculates deltas between negative sequence voltages of the load-primary power source pair $\Delta V_{(neg\ seq\ primary\ power\ source-neg\ seq\ load)}$) and the load-secondary power source pair $\Delta V_{(neg\ seq\ secondary\ power\ source-neg\ seq\ load)}$.

At 550, with load voltages as reference, the controller generates trends of $\Delta V_{(neg\ seq\ primary\ power\ source-neg\ seq\ load)}$) and $\Delta V_{(neg\ seq\ secondary\ power\ source-neg\ seq\ load)}$.

At 560, the controller compares the trends with thresholds.

At 570, the controller determines whether the trends are outside of the thresholds. If no, the method 500 returns to 510. If yes, the method 500 proceeds to 580.

At 580, the controller alerts a user, e.g., a field engineer, a utility engineer, etc. of detection of a loose joint, overtight joint or contact wear and identification of the loose joint, overtight joint or contact wear. The field engineer receives the alert and performs maintenance to joints and contacts located at the identified measurement location. The alert may be an alarm, visual and/or audible.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of disclosed concept which is to be given the full breadth of the claims appended and any and all equivalents thereof.

What is claimed is:

1. A method of monitoring joint and contact conditions in an automatic transfer switch, comprising:
    collecting electrical signals at a plurality of measurement locations in the automatic transfer switch including a power switching mechanism having a contact, the measurement locations being associated with a plurality of power sources and a load over a predetermined period, the measurement locations including a first input joint for the contact of the automatic transfer switch, the first input joint connected to a primary power source, a second input joint for the contact, the second input joint connected to a secondary power source and an output joint of the contact, the output joint connected to the load, the electrical signals including voltages and load current, the contact being operable to selectively switch between the first input joint to provide the load with power from the primary power source and the second input joint to provide the load with power from the secondary power source;
    obtaining deltas between source voltages and corresponding load voltage measured at the measurement locations over the predetermined period, the deltas including a voltage drop between input voltage measured at the first input joint for the primary power source and output voltage measured at the output joint for the load or a voltage drop between input voltage measured at the second input joint for the secondary power source and the output voltage measured at the output joint;
    comparing the deltas with thresholds obtained during healthy condition, thresholds having been derived based at least in part on temperature changes measured at the measurement locations;
    determining that the deltas fall outside of the thresholds; and
    in response to determining that the deltas fall outside of the threshold,
    transmitting an alert to a user, the alert indicating a detection of one or more failure modes at the measurement locations.

2. The method of claim 1, further comprising:
    identifying location of the one or more failure modes based on the deltas.

3. The method of claim 2, wherein the alert includes identification of the location of the one or more failure modes.

4. The method of claim 3, wherein the detection and identification of the location of the one or more failure modes are made without using an external sensor structured to be installed at the measurement locations.

5. The method of claim 1, wherein collecting electrical signals at the plurality of measurement locations comprises:
    measuring three-phase voltages at the first input joint for the primary power source, second input joint for the secondary power source, and the output joint for the load, wherein the measurement locations comprising the first input joint, the second input joint, and the output joint;
    measuring load current at one of the first input joint, the second input joint or the output joint;
    performing data filtering for a predefined number; and
    computing negative sequence of primary power source voltage, negative sequence of secondary power source voltage, and negative sequence of the load voltage based on measured three-phase voltages and three-phase current.

6. The method of claim 5, wherein measuring three-phase voltages comprises at least one of three-phase root-mean-square voltages or three-phase phasor voltages.

7. The method of claim 5, wherein measuring three-phase voltages at the first input joint for the primary power source, the second input joint for the secondary power source, and the output joint for the load comprises:
    simultaneously measuring the three-phase voltages at the first input joint and the output joint; or simultaneously measuring the three-phase voltages at the second input joint and the output joint.

8. The method of claim 5, wherein performing data filtering for the predefined number comprises obtaining a moving average for the predefined number.

9. The method of claim 5, wherein obtaining deltas between source voltages and corresponding load voltage measured at the measurement locations over the predetermined period comprises:
 obtaining first delta between the negative sequence of the primary power source voltage and the negative sequence of the load voltage; and
 obtaining second delta between the negative sequence of the secondary power source voltage and the negative sequence of the load.

10. The method of claim 9, wherein comparing the deltas with the thresholds obtained during healthy condition comprises:
 generating trends of the first delta and the second delta; and
 comparing the generated trends to trends plotting the thresholds.

11. The method of claim 10, wherein determining that the deltas fall outside of the thresholds comprises:
 determining that at least one of the generated trends of the first and second delta falls outside of the thresholds.

12. The method of claim 11, wherein the determination that at least one of the generated trends of the first and second deltas falls outside of the thresholds indicates presence of a loose joint condition, an overtight joint condition, or a contact wear.

13. The method of claim 12, wherein the presence of the loose joint condition indicates presence of a hotspot.

14. The method of claim 1, wherein the voltage drop reflects changes in contact resistance at respective measurement locations.

15. The method of claim 14, wherein additional changes in the contact resistance as compared to changes in the contact resistance associated with the thresholds result in deviation from the thresholds.

16. The method of claim 15, wherein the additional changes indicate at least one of a loose joint condition, an overtight joint condition, or a contact wear at the respective measurement locations.

17. A method of establishing thresholds for use in detecting a failure mode in an automatic transfer switch, comprising:
 collecting electrical signals at a plurality of measurement locations in the automatic transfer switch including a power switching mechanism having a contact, the measurement locations being associated with a plurality of power sources and a load over a predetermined period, the measurement locations including a first input joint for the contact of the automatic transfer switch, the first input joint connected to a primary power source, a second input joint for the contact, the second input joint connected to a secondary power source and an output joint of the contact, the output joint connected to the load, the electrical signals including voltages and load current, the contact being operable to selectively switch between the first input joint to provide the load with power from the primary power source and the second input joint to provide the load with power from the secondary power source;
 performing data filtering for a predefined number;
 obtaining deltas between source voltages and corresponding load voltage measured at the measurement locations over the predetermined period, the deltas include a voltage drop between input voltage measured at the first input joint for a primary power source and output voltage measured at the output joint for the load or a voltage drop between input voltage measured at the second input joint for the secondary power source and the output voltage measured at the output joint;
 generating trends of the deltas over the predetermined period; and
 deriving the thresholds based on the trends of the deltas and on temperature changes measured at the measurement locations.

18. The method of claim 17, further comprising:
 computing negative sequence of three-phase voltages measured at each measurement location.

19. The method of claim 18, wherein the deltas include deltas between the negative sequence of three-phase source voltages and the negative sequence of three-phase load voltages.

* * * * *